(12) United States Patent
Tanamoto et al.

(10) Patent No.: US 8,856,199 B2
(45) Date of Patent: Oct. 7, 2014

(54) RANDOM NUMBER GENERATOR CIRCUIT AND CRYPTOGRAPHIC CIRCUIT

(75) Inventors: Tetsufumi Tanamoto, Kawasaki (JP); Mari Matsumoto, Yokohama (JP); Shinobu Fujita, Tokyo (JP); Kazutaka Ikegami, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 344 days.

(21) Appl. No.: 13/301,932

(22) Filed: Nov. 22, 2011

(65) Prior Publication Data

US 2012/0089656 A1 Apr. 12, 2012

Related U.S. Application Data

(63) Continuation of application No. PCT/JP2009/059446, filed on May 22, 2009.

(51) Int. Cl.
*G06F 1/02* (2006.01)
*G06F 7/58* (2006.01)
*H03M 13/00* (2006.01)
*H03K 3/84* (2006.01)

(52) U.S. Cl.
CPC ... *H03K 3/84* (2013.01); *G06F 7/58* (2013.01)
USPC ............................. 708/255; 708/250; 714/781

(58) Field of Classification Search
USPC ................................................. 708/250–256
See application file for complete search history.

(56) References Cited

U.S. PATENT DOCUMENTS

| | | | | |
|---|---|---|---|---|
| 4,160,236 A * | 7/1979 | Oka et al. | ...................... | 714/774 |
| 4,853,884 A * | 8/1989 | Brown et al. | ..................... | 708/3 |
| 5,757,923 A * | 5/1998 | Koopman, Jr. | .................. | 380/46 |
| 6,192,498 B1 * | 2/2001 | Arato | ............................ | 714/781 |
| 6,298,360 B1 * | 10/2001 | Muller | .......................... | 708/250 |

(Continued)

FOREIGN PATENT DOCUMENTS

| JP | 2-145010 A | 6/1990 |
|---|---|---|
| JP | 2002-24046 A | 1/2002 |

(Continued)

OTHER PUBLICATIONS

M. Dichtl "Bad and good ways of post-processing biased physical random numbers", Proc. FSE '07, vol. 4593, pp. 127-152, 2007.*

(Continued)

*Primary Examiner* — Chuong D Ngo
*Assistant Examiner* — Matthew Sandifer
(74) *Attorney, Agent, or Firm* — Oblon, Spivak, McClelland, Maier & Neustadt, L.L.P.

(57) ABSTRACT

A random number generator circuit includes: an element generating and outputting physical random numbers; a digitizing circuit digitizing the physical random numbers to output a random number sequence tested by a testing circuit; and an error correcting code circuit including a shift register having the random number sequence input thereto, a multiplier multiplying the stored random number sequence by an error-correcting-code generating matrix, and a selector switch outputting one of an output of the shift register and an output of the multiplier in accordance with a test result obtained by the testing circuit. The error correcting code circuit outputs the output of the multiplier as a corrected random number sequence from the selector switch when the result of a test conducted by the testing circuit indicates a rejection. The testing circuit tests the corrected random number sequence when the result of the test indicates a rejection.

22 Claims, 17 Drawing Sheets

(56) References Cited

U.S. PATENT DOCUMENTS

| | | | |
|---|---|---|---|
| 6,374,278 B1* | 4/2002 | Korn et al. | 708/250 |
| 6,725,375 B2 | 4/2004 | Fujioka | |
| 7,788,307 B2 | 8/2010 | Yushiya | |
| 8,039,890 B2* | 10/2011 | Matsumoto et al. | 257/325 |
| 8,510,608 B2* | 8/2013 | Futa et al. | 714/52 |
| 2002/0053062 A1* | 5/2002 | Szymanski | 714/801 |
| 2004/0006580 A1* | 1/2004 | Miller, Jr. | 708/250 |
| 2004/0039762 A1 | 2/2004 | Hars | |
| 2005/0204220 A1* | 9/2005 | Yasuda et al. | 714/724 |
| 2006/0173943 A1* | 8/2006 | Luzzi et al. | 708/250 |
| 2007/0067692 A1* | 3/2007 | Dichtl | 714/738 |
| 2007/0162806 A1* | 7/2007 | Matsumoto et al. | 714/728 |
| 2008/0052577 A1* | 2/2008 | Tanaka et al. | 714/728 |
| 2009/0327379 A1 | 12/2009 | Matsumoto et al. | |
| 2010/0017692 A1* | 1/2010 | Kwak | 714/807 |
| 2010/0057820 A1 | 3/2010 | Matsumoto et al. | |
| 2010/0313104 A1* | 12/2010 | Bommena et al. | 714/807 |
| 2011/0022648 A1* | 1/2011 | Harris et al. | 708/254 |

FOREIGN PATENT DOCUMENTS

| | | |
|---|---|---|
| JP | 2005-536796 | 12/2005 |
| JP | 2007-11579 A | 1/2007 |
| JP | 2008-165500 | 7/2008 |

OTHER PUBLICATIONS

Lacharme, "Post-processign functions for a biased physical random number generator", slides from presentation at Fast Software Encryption '08, FSE '08, retrieved from http://www.iacr.org/workshops/fse2008/docs/slides/day_2_sess_4/SlidesLacharme.pdf.*

Kwok et al, "A comparison of post-processing techniques for biased random number generators," In Proceedings of the 5th IFIP WG 11.2 international conference on Information security theory and practice: security and privacy of mobile devices in wireless communication, pp. 175-190, 2011.*

D. Schellekens, B. Preneel, and I. Verbauwhede, "FPGA vendor agnostic true random number generator," in Proceedings of the International Conference on Field Programmable Logic and Applications (FPL '06), pp. 1-6, IEEE, 2006.*

International Preliminary Report on Patentability with Written Opinion issued Dec. 22, 2011, in International Application No. PCT/JP2009/059446 (English translation).

Office Action issued Aug. 13, 2013, in Japanese Patent Application No. 2011-514268 with English translation.

International Search Report mailed Jun. 23, 2009 in PCT/JP2009/059446 filed May 22, 2009.

Patrick Lacharme "Post-processing functions for a biased physical random number generator", Proceedings of Fast Software Encryption 2008, 10 pages.

Mari Matsumoto et al., "1200μm2 Physical Random-Number Generators Based on SiN MOSFET for Secure Smart-Card Application", International Solid State Circuits Conference 2008, 3 pages.

Ralf Brederlow et al., "A Low-Power True Random Number Generator using Random Telegraph Noise of Single Oxide-Traps", International Solid State Circuits Conference 2006, 10 pages.

* cited by examiner

FIG. 9

(7, 4) CODE IS USED TWICE

| RANDOM NUMBER DATA A | RANDOM NUMBER DATA B |
|---|---|
| 1 0 1 0 1 0 0 1 0 1 1 0 1 1 1 1 1 ... | 0 1 1 1 0 0 1 1 0 0 1 0 0 0 0 1 1 ... |

(a)

RESULTS OF TESTS CONDUCTED BY TWO-TIME APPLICATION OF (7,4)-CODE CODE GENERATING MATRIX

| CODE APPLIED SECOND TIME | RANDOM NUMBER DATA A | RANDOM NUMBER DATA B |
|---|---|---|
| monobit | 9684 NG! | 9625 NG! |
| Poker test | 331.1424 NG! | 255.648 NG! |
| Run test | | |
| '0' run count[1] | 2626 Pass! | 2493 Pass! |
| '0' run count[2] | 1126 Pass! | 1131 Pass! |
| '0' run count[3] | 570 Pass! | 563 Pass! |
| '0' run count[4] | 364 Pass! | 376 Pass! |
| '0' run count[5] | 157 Pass! | 152 Pass! |
| '0' run count[6] | 191 Pass! | 214 NG! |
| '1' run count[1] | 2543 NG! | 2415 Pass! |
| '1' run count[2] | 1398 NG! | 1376 Pass! |
| '1' run count[3] | 572 Pass! | 621 Pass! |
| '1' run count[4] | 247 Pass! | 241 Pass! |
| '1' run count[5] | 147 Pass! | 147 Pass! |
| '1' run count[6] | 127 Pass! | 130 Pass! |
| Long run test | | |
| longest run of '0' | 19 Pass! | 23 Pass! |
| longest run of '1' | 12 Pass! | 16 Pass! |

(b)

RANDOM NUMBER QUALITY IS INCREASED (a)

(15, 5, 7)-BCH-CODE GENERATING MATRIX $$G = \begin{pmatrix} 1 & 0 & 0 & 0 & 0 & 1 & 0 & 1 & 0 & 0 & 1 & 1 & 0 & 1 & 1 \\ 0 & 1 & 0 & 0 & 0 & 1 & 1 & 1 & 1 & 0 & 1 & 0 & 1 & 1 & 0 \\ 0 & 0 & 1 & 0 & 0 & 0 & 1 & 1 & 1 & 1 & 0 & 1 & 0 & 1 & 1 \\ 0 & 0 & 0 & 1 & 0 & 1 & 1 & 1 & 0 & 1 & 1 & 1 & 1 & 0 & 0 \\ 0 & 0 & 0 & 0 & 1 & 1 & 0 & 1 & 1 & 0 & 1 & 1 & 1 & 0 & 1 \end{pmatrix}$$

(b)

| CODE APPLIED FIRST TIME | RANDOM NUMBER DATA A | RANDOM NUMBER DATA B |
|---|---|---|
| monobit | 10193 Pass! | 9964 Pass! |
| Poker test | 250.5088 NG! | 190.9888 NG! |
| Run test | | |
| '0' run count[1] | 2021 NG! | 2084 NG! |
| '0' run count[2] | 1775 NG! | 1695 NG! |
| '0' run count[3] | 436 NG! | 401 NG! |
| '0' run count[4] | 204 NG! | 228 NG! |
| '0' run count[5] | 101 NG! | 116 Pass! |
| '0' run count[6] | 208 Pass! | 236 NG! |
| '1' run count[1] | 2019 NG! | 2158 NG! |
| '1' run count[2] | 1209 Pass! | 1236 Pass! |
| '1' run count[3] | 879 NG! | 764 NG! |
| '1' run count[4] | 324 Pass! | 292 Pass! |
| '1' run count[5] | 165 Pass! | 151 Pass! |
| '1' run count[6] | 149 Pass! | 159 Pass! |
| Long run test | | |
| longest run of '0' | 22 Pass! | 23 Pass! |
| longest run of '1' | 12 Pass! | 13 Pass! |

FIG. 10

RANDOM NUMBER GENERATOR CIRCUIT AND CRYPTOGRAPHIC CIRCUIT

CROSS-REFERENCE TO RELATED APPLICATION

This application is based upon and claims the benefit of priority from prior PCT/JP2009/059446 filed on May 22, 2009 in Japan, the entire contents of which are incorporated herein by reference.

FIELD

Embodiments described herein relate generally to a random number generator circuit used in mobile devices, and a cryptographic circuit using the random number generator circuit.

BACKGROUND

As mobile devices such as portable telephone devices, IC cards, and the like are rapidly becoming common, there is an increasing demand for tightening security measures to protect personal information in small-sized electronic circuits. In response to that trend, the demand for high-quality, small-sized random number generator circuits that are manufactured by one of fundamental security techniques has been becoming greater year by year. In recent years, the need of physical random numbers using natural fluctuations, instead of pseudorandom numbers generated by software, has been emphasized.

In such circumstances, physical random number generating elements and circuits that amplify physical phenomena, particularly, transistor noise, have been suggested recently. Typical examples of random number generator circuits that have been suggested include random number generator circuits that utilize 1/f noise of SI transistors (MOSFETs), and random number generator circuits that are smaller in size and use SiN transistors having the function to generate random numbers at a high speed.

In those random number generator circuits that utilize transistor noise, however, the noise characteristics slightly vary among conventional transistors. Therefore, with device variations in and among wafers being taken into account, optimization needs to be performed for each individual chip (random number generator circuit) before shipment from the factory. Also, it is necessary to prepare a correcting circuit that performs readjustment on the optimum operating voltage or the like in accordance with a secular change in transistor characteristics due to use over the years, and there have been problems such as an increase in circuit area and a decrease in reliability.

In the academic field, Patrick Lacharme mathematically maintains that the quality of random numbers is increased by using a code generating matrix called Error Correcting Code (ECC) according to a code theory (see the literature, "Post-processing functions for a biased physical random number generator," Fast Software Encryption (FSE), 2008, pp. 10-13, February 2008). In a case where an input signal sequence consisting of n pieces of data "0" and "1" is $(x_1, x_2, \ldots, x_n)$, one of the data "0" and the data "1" appears with probability 1/2 if the data "0" and the data "1" appear completely at random. However, the actual appearance ratio is not 1/2. Where the shift or deviation from 1/2 is represented by e/2 (0<e<1), or where the probabilities of appearance of the data "0" and the data "1" are expressed as (1+e)/2 and (1−e)/2, respectively, the deviation e/2 of the data "0" and the data "1" is expressed as $e^d/2$ (see theorem 1 in the literature) in the following new signal sequence $(y_1, y_2, \ldots, y_m)$:

$$\begin{pmatrix} g_{11} & g_{12} & \cdots & g_{1n} \\ g_{21} & g_{22} & \cdots & g_{2n} \\ \vdots & \vdots & \ddots & \vdots \\ g_{m1} & g_{m2} & \cdots & g_{mn} \end{pmatrix} \begin{pmatrix} x_1 \\ x_2 \\ \vdots \\ x_n \end{pmatrix} = \begin{pmatrix} y_1 \\ y_2 \\ \vdots \\ y_m \end{pmatrix} \quad (1)$$

which is converted by using the following code generating matrix G for error corrections in communication circuits:

$$G = \begin{pmatrix} g_{11} & g_{12} & \cdots & g_{1n} \\ g_{21} & g_{22} & \cdots & g_{2n} \\ \vdots & \vdots & \ddots & \vdots \\ g_{m1} & g_{m2} & \cdots & g_{mn} \end{pmatrix} \quad (2)$$

At this point, d represents the minimum distance of the linear code formed from the code generating matrix G. In that case, the relationship, n>m, is established. By compressing data, the entropy of random number data is essentially increased.

According to the above literature, the deviation is reduced, but it is not clear whether a commercial random number test that is being actually used can be passed. Also, according to the above literature, a shift register is used, but it is not clear how a shift register is to be incorporated into an actual physical random number generator circuit as a system. That is, if the equation (1) is simply formed into a circuit, only excess overhead is added to the random number generator circuit, resulting in a low efficiency.

BRIEF DESCRIPTION OF THE DRAWINGS

FIG. 9(a) is a diagram showing the random numbers obtained by multiplying physical random numbers by a (7, 4) code twice;

FIG. 9(b) is a diagram showing the results of tests conducted on the random numbers shown in FIG. 9(a);

FIG. 10(a) is a diagram showing a (15, 5, 7)-BCH-code generating matrix;

FIG. 10(b) is a diagram showing the results of tests conducted by one-time multiplication of a (15, 5, 7)-BCH-code generating matrix;

DETAILED DESCRIPTION

Figure 1:
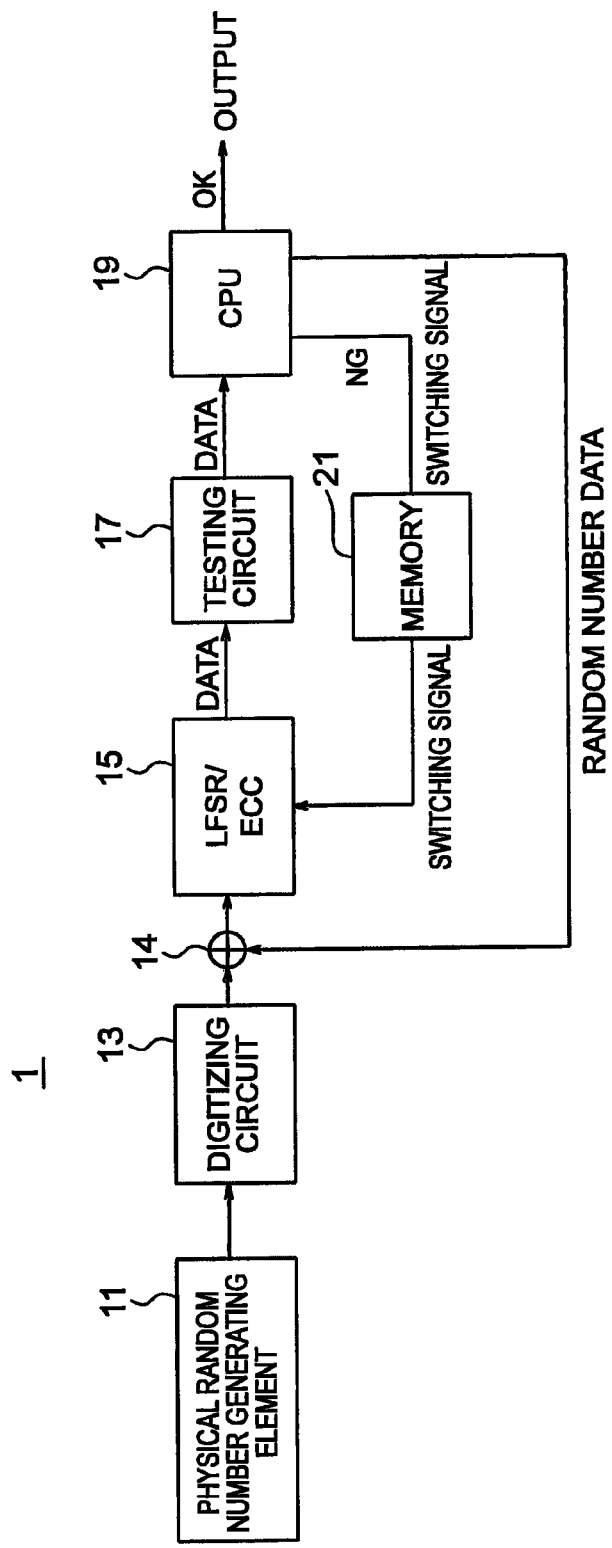
FIG. 1 is a block diagram of a random number generator circuit according to a first embodiment.

A random number generator circuit according to an embodiment includes: a physical random number generating element generating and outputting physical random numbers; a digitizing circuit digitizing the physical random numbers and outputting a random number sequence; a testing circuit testing the random number sequence; and an error correcting code circuit including: a shift register having the random number sequence input thereto; a multiplier multiplying the random number sequence stored in the shift register by an error-correcting-code generating matrix; and a selector switch selecting and outputting one of an output of the shift register and an output of the multiplier in accordance with a result of a test conducted by the testing circuit, the error correcting code circuit outputting the output of the multiplier as a corrected random number sequence from the selector switch when the result of a test conducted by the testing circuit indicates a rejection, the testing circuit testing the corrected random number sequence when the result of the test indicates a rejection.

The present invention is outlined before embodiments of the present invention are described.

An ECC function can be formed into a circuit only where the code generating matrix is expressed as follows:

$$G = \begin{pmatrix} g_{n-k} & g_{n-k-1} & \cdots & g_0 & 0 & \cdots & 0 \\ 0 & g_{n-k} & g_{n-k-1} & \cdots & g_0 & & \vdots \\ \vdots & & & & & \ddots & 0 \\ 0 & & & g_{n-k} & g_{n-k-1} & \cdots & g_0 \end{pmatrix} \quad (3)$$

In general, a code theory can be expressed by a polynomial. Therefore, the generator polynomial representing the code generating matrix indicated by the equation (3) can be expressed as:

$$G(x) = g_{n-k}x^{n-k} + g_{n-k-1}x_{n-k-1} + g_1 x + g_0 \quad (4)$$

Where input data is expressed as:

$$b(x) = \Sigma b_i x^i \quad (5)$$

At this point, the matrix operation according to the equation (4) can be expressed as $G(x) \cdot b(x)$. For example, the code generating matrix for encoding 7-bit data into 4-bit data is expressed as:

$$\begin{pmatrix} g_3 & g_2 & g_1 & g_0 & 0 & 0 & 0 \\ 0 & g_3 & g_2 & g_1 & g_0 & 0 & 0 \\ 0 & 0 & g_3 & g_2 & g_1 & g_0 & 0 \\ 0 & 0 & 0 & g_3 & g_2 & g_1 & g_0 \end{pmatrix} \begin{pmatrix} b_0 \\ b_1 \\ b_2 \\ b_3 \\ b_4 \\ b_5 \\ b_6 \end{pmatrix} = \begin{pmatrix} g_3 b_0 + g_2 b_1 + g_1 b_2 + g_0 b_3 \\ g_3 b_1 + g_2 b_2 + g_1 b_3 + g_0 b_4 \\ g_3 b_2 + g_2 b_3 + g_1 b_4 + g_0 b_5 \\ g_3 b_3 + g_2 b_4 + g_1 b_5 + g_0 b_6 \end{pmatrix} \quad (6)$$

The respective elements of the code generating matrix expressed by the right-hand side of the equation (6) match the coefficients of the third through sixth orders of the product of polynomials expressed by the following equation:

$$G(x)b(x) = g_0 b_0 + (g_0 b_1 + g_1 b_0)x + (g_0 b_2 + g_1 b_1 + g_2 b_0)x^2 + \quad (7)$$
$$(g_0 b_3 + g_1 b_2 + g_2 b_1 + g_3 b_0)x^3 + (g_0 b_4 + g_1 b_3 + g_2 b_2 + g_3 b_1)x^4 +$$
$$(g_0 b_5 + g_1 b_4 + g_2 b_3 + g_3 b_2)x^5 + (g_0 b_6 + g_1 b_5 + g_2 b_4 + g_3 b_3)x^6 +$$
$$(g_1 b_6 + g_2 b_5 + g_3 b_4)x^7 + (g_2 b_6 + g_3 b_5)x^8 + g_3 b_6 x^9$$

Each of the elements of the code generating matrix expressed by the right-hand side of the equation (6) is part of the product of the polynomials. As can be seen from the form of the product of the polynomials, generation of codes can be performed with the use of a shift register.

Not only a physical random number source but also a linear feedback shift register (hereinafter also referred to as LFSR) is often used in a physical random number generator circuit. An error correcting code circuit (ECC circuit) using a generating matrix is also mounted on the memory unit provided in IC cards such as NAND flash memories or EEPROMs, or in security systems for portable telephone devices.

In an embodiment, the shift register representing multiplication of the code generating matrix is not used separately from the physical random number generator circuit, and a conventional LFSR is modified. Accordingly, the area is not greatly increased from the area of a conventional physical random number generator circuit, and excess overhead can be minimized. In this manner, the above described random number smoothing can be performed, or deviation can be made smaller.

The following is a description of embodiments, with reference to the accompanying drawings.

First Embodiment

FIG. 1 shows a random number generator circuit according to a first embodiment. The random number generator circuit 1 of this embodiment includes a physical random number generating element 11, a digitizing circuit 13, an XOR gate 14, a LFSR and ECC circuit (hereinafter also referred to as a LFSR/ECC circuit) 15, a testing circuit 17, a CPU 19, and a memory 21. The physical random number generating element 11 generates physical random numbers that are analog signals. The digitizing circuit 13 converts the physical random numbers as the analog signals output from the physical random number generating element 11 into random numbers as digital signals consisting of "0" and "1." At this point, the quality of the random numbers is smoothed. Normally, a testing circuit and a LFSR are provided thereafter, and the quality of the random numbers is checked (tested) and smoothed. In this embodiment, the LFSR is improved, and the ECC function to perform multiplication by a code generating matrix is executed by switching on and off a selector switch provided in the LFSR/ECC circuit 15.

The testing circuit 17 may be formed by forming mathematical tests into a circuit as disclosed in JP-A 2007-164434 (KOKAI), or may be formed by simplifying the tests as disclosed in Japanese Patent Publication No. 4094570. The later described FIPS 140-2 or the like may be used as software. The output signal (a test result) from the testing circuit 17 is sent to the central processing unit (CPU) 19, as shown in FIG. 1. If the test result indicates an acceptance, the random number data is used as it is. If the test result indicates a rejection, the switching signal shown in FIG. 1 is sent to the memory 21, and, at the same time, the random number data is returned to one of the input terminals of the XOR gate 14.

The XOR gate 14 performs an exclusive-OR operation on the output of the digitizing circuit 13 and rejected random number data sent from the CPU 19, and transmits the operation result to the LFSR/ECC circuit 15. In this embodiment, the XOR gate 14 is provided between the digitizing circuit 13 and the LFSR/ECC circuit 15. Instead of the XOR gate 14, the later described switch circuit 22 shown in FIG. 13 may be provided, for example. In that case, the switch circuit is connected in such a manner that the output of the digitizing circuit 13 is normally sent to the LFSR/ECC circuit 15, but, when the result of the test conducted by the testing circuit 17 indicates a rejection, the switch circuit switches the connection to such a connection that rejected random number data sent from the CPU 19 is sent to the LFSR/ECC circuit 15.

The LFSR/ECC circuit 15 is a circuit formed by integrating the function to multiply a data string by the later described LFSR for generating random numbers and a code generating matrix (the operations of the respective elements of the matrix on the right-hand side of the equation (6)) or the ECC function. The LFSR/ECC circuit 15 has two kinds of characteristics that can be switched by switching on or off of a transistor, and which transistor is to be switched on or off is written in the memory 21 shown in FIG. 1. By the switching signal shown in FIG. 1, the LFSR/ECC circuit 15 is switched from the random number generating LFSR to the ECC circuit that multiplies random number data by a code generating matrix. In this manner, the quality of the random numbers can be increased. The random number data multiplied by a code generating matrix again enters the testing circuit 17, and is subjected to a test. If an acceptance signal is sent from the testing circuit 17 to the CPU 19, the random number data can be used as random numbers. If a rejection signal is sent, a switching signal is sent to the memory 21, and the random numbers are sent to the LFSR/ECC circuit 15 via the XOR gate 14, and the operations of the matrix shown on the right-hand side of the equation (6) are again performed.

As the physical random number generating element 11, one of the following devices can be used: a device that uses a quantum-dot system as disclosed in Japanese Patent Publication No. 3,974,429; a MOSFET having conductive fine particles that can perform electron charge and discharge on the channel via a tunnel insulating film, as disclosed in JP-A 2005-167165(KOKAI); a MOSFET that has random noise in the current flowing between the source and the drain, as disclosed in JP-A 2008-299595; a device that uses a trap existing therein, as disclosed in U.S. Pat. No. 7,426,527 and German Patent Publication No. 102004011170; a device that utilizes current fluctuations as disclosed in French Patent Publication No. 2817361, and the like. Also, a random number generating element that utilizes an oscillator and a jitter can be used as disclosed in German Patent Publication No. 2000060006650, or a device that utilizes two clocks and VCO can be used as disclosed in German Patent Publication No. 2000010003472.

Figure 2:
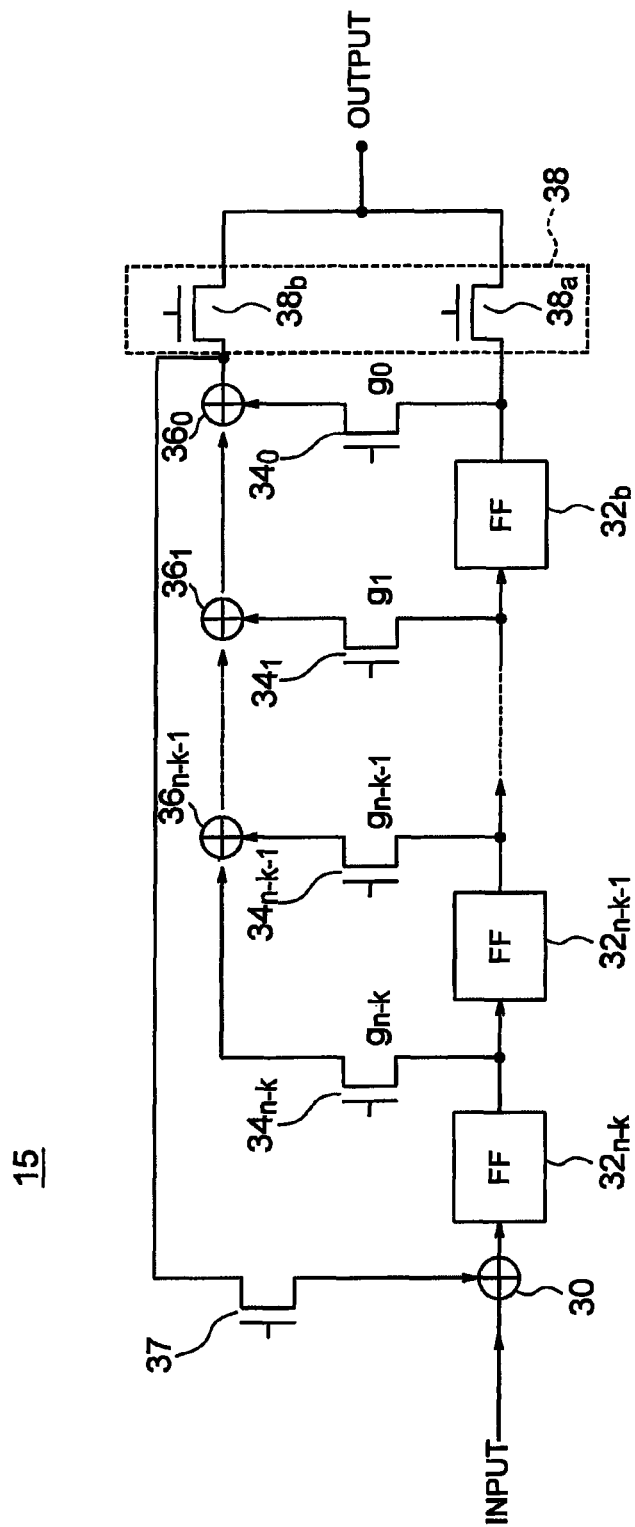
FIG. 2 is a circuit showing a specific example of a LFSR/ECC circuit according to the first embodiment.

FIG. 2 shows a specific example of the LFSR/ECC circuit 15 of this embodiment. The specific example of the LFSR/ECC circuit 15 uses the generator polynomial expressed by the equation (4), and includes: an XOR gate 30 that has an input terminal to receive digital random numbers sent as input signals (for example, digital random numbers sent from the digitizing circuit 13 via the XOR gate 14 (such as a random number sequence $b_6$, $b_5$, $b_4$, $b_3$, $b_2$, $b_1$, and $b_0$)); (n−k+1) flip-flops $32_{n-k}$, $32_{n-k-1}$, ..., $32_1$, and $32_0$ that are connected in series; (n−k+1) N-channel pass transistors $34_{n-k}$, $34_{n-k-1}$, ..., $34_1$, and $34_0$; (n−k) XOR gates $36_{n-k-1}$, ..., $36_1$, and $36_0$; a selector switch 37 formed with an N-channel transistor; and a selector switch circuit 38 that are formed with N-channel transistors 38a and 38b.

One terminal of each pass transistor $34_i$ (i=n−k, ..., 1, 0) is connected to the output terminal of each corresponding flip-flop $32_i$, and has a gate to receive a signal corresponding to the ith-order coefficient $g_i$ of the generator polynomial stored in the memory 21. That is, where the ith-order coefficient $g_i$ of the generator polynomial is "0," the gate of each pass transistor $34_i$ (i=n−k, ..., 1, 0) receives a signal for switching off the pass transistor $34_i$. Where the coefficient $g_i$ of the generator polynomial is "1," the gate of each pass transistor $34_i$ receives a signal for switching on the pass transistor $34_i$.

The two input terminals of the XOR gate $36_{n-k-1}$ are connected to the other terminal of the pass transistors $34_{n-k}$ and $34_{n-k-1}$, and perform an exclusive-OR operation on signals that are input to those input terminals. One of the input terminals of each XOR gate $36_i$ (i=n−k−2, ..., 1, 0) is connected to the other terminal of each corresponding pass transistor $34_i$, and the other one of the input terminals is connected to the output terminal of each corresponding XOR gate $36_{i-1}$. Each XOR gate $36_i$ performs an XOR operation on signals that are input to those input terminals. That is, the output of the XOR gate $36_0$ is the result of the exclusive-OR operations performed on the signals sent through the other terminals of the (n−k+1) pass transistors $34_{n-k}$, $34_{n-k-1}$, ..., $34_1$, and $34_0$, and the (n−k) XOR gates $36_{n-k-1}$, $36_1$, and $36_0$ constitute one XOR gate.

The gate of the selector switch 37 receives a switching signal that is output from the CPU 19 and is stored in the memory 21, so that the selector switch 37 operates. The output of the XOR gate $36_0$ is sent to the other input terminal of the XOR gate 30. Therefore, the XOR gate 30 performs an exclusive-OR operation on the output of the XOR gate $36_0$ and the output of the XOR gate 14, and sends the result of the operation to the flip-flop $32_{n-k}$.

The gate of the transistor 38a of the selector switch circuit 38 receives a switching signal stored in the memory 21, so that the transistor 38a operates. The output of the flip-flop $32_0$ is sent to the testing circuit 17. The gate of the transistor 38b receives a switching signal stored in the memory 21, so that the transistor 38b operates. The output of the XOR gate $36_0$ is sent to the testing circuit 17.

The operation of the LFSR/ECC circuit 15 having the above structure is now described. First, the transistor 38a is switched on, and the random numbers sent from the XOR gate 14 are sent to the LFSR via the XOR gate 30. At this point, the transistor 38b is in an OFF state. The random numbers are then sent to the testing circuit 17 shown in FIG. 1 via the selector switch 37 and the transistor 38a, and are tested.

If the random numbers pass the test, the random numbers are output from the random number generator circuit 1. If the random numbers do not pass the test (NG) at the testing circuit 17, the selector switch 37 and the transistor 38a are turned off, and multiplication of the data string of the rejected random numbers by a code generating matrix (the operation of the matrix shown on the right-hand side of the equation (6)) is performed. At this point, the random number data multiplied by the code generating matrix is obtained by switching on the transistor 38b, and is again sent to the testing circuit 17 shown in FIG. 1 for a test.

If the random numbers pass the test, the random numbers are output to the outside from the random number generator circuit 1. If the random numbers do not pass the test, multiplication of the data string of the rejected random numbers by a code generating matrix is again performed. At this point, the code generating matrix used in the first multiplication and the code generating matrix used in the second multiplication may be the same or may differ from each other. This aspect is determined by the history and characteristics of each individual device. Which code generating matrix is to be used is controlled by switching on or off the corresponding pass transistors in accordance with the values of the coefficients $g_{n-k}, g_{n-k-1}, \ldots, g_1$, and $g_0$ of the generator polynomial.

In FIG. 2, only N-channel transistors are used as the pass transistors, for ease of explanation. However, N-channel transistors and P-channel transistors are normally used together. Also, the optimum code might vary with age-related degradation. In that case, the optimum code is checked when a user accesses a system such as an ATM system, and which pass transistors are to be switched on may be written into the memory unit in a portable terminal of the user.

Referring now to FIGS. 3 through 6, an example of the LFSR and switching of (7, 4)-linear-code code generating matrixes are described. At this point, the (n, k) code of a correction code is an n-bit code formed by adding (n–k) redundant bits to k-bit data, and is to be used for communications and the like. A (7, 4)-code code generating matrix in a case where the generator polynomial $G(x)$ is $x^3+x^2+1$ is expressed as follows:

$$\begin{pmatrix} 1 & 1 & 0 & 1 & 0 & 0 & 0 \\ 0 & 1 & 1 & 0 & 1 & 0 & 0 \\ 0 & 0 & 1 & 1 & 0 & 1 & 0 \\ 0 & 0 & 0 & 1 & 1 & 0 & 1 \end{pmatrix}$$

Figure 3:
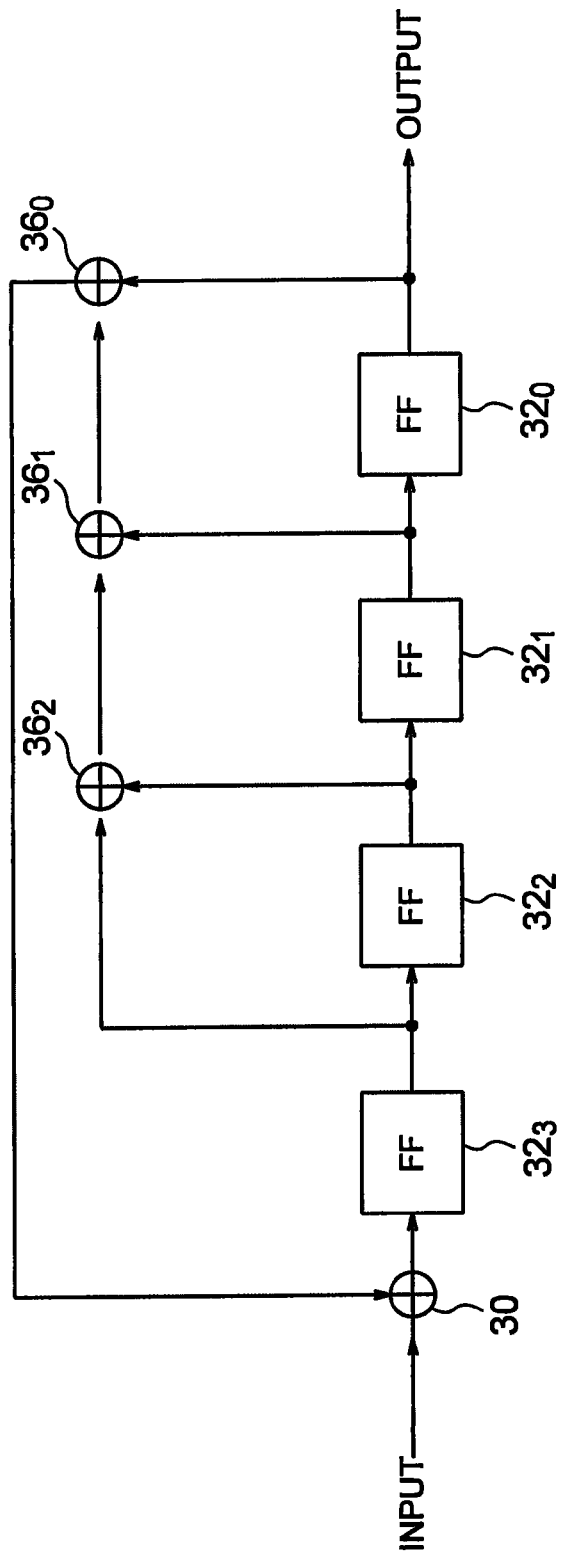
FIG. 3 is a circuit diagram showing a specific example of a LFSR.
Figure 4:
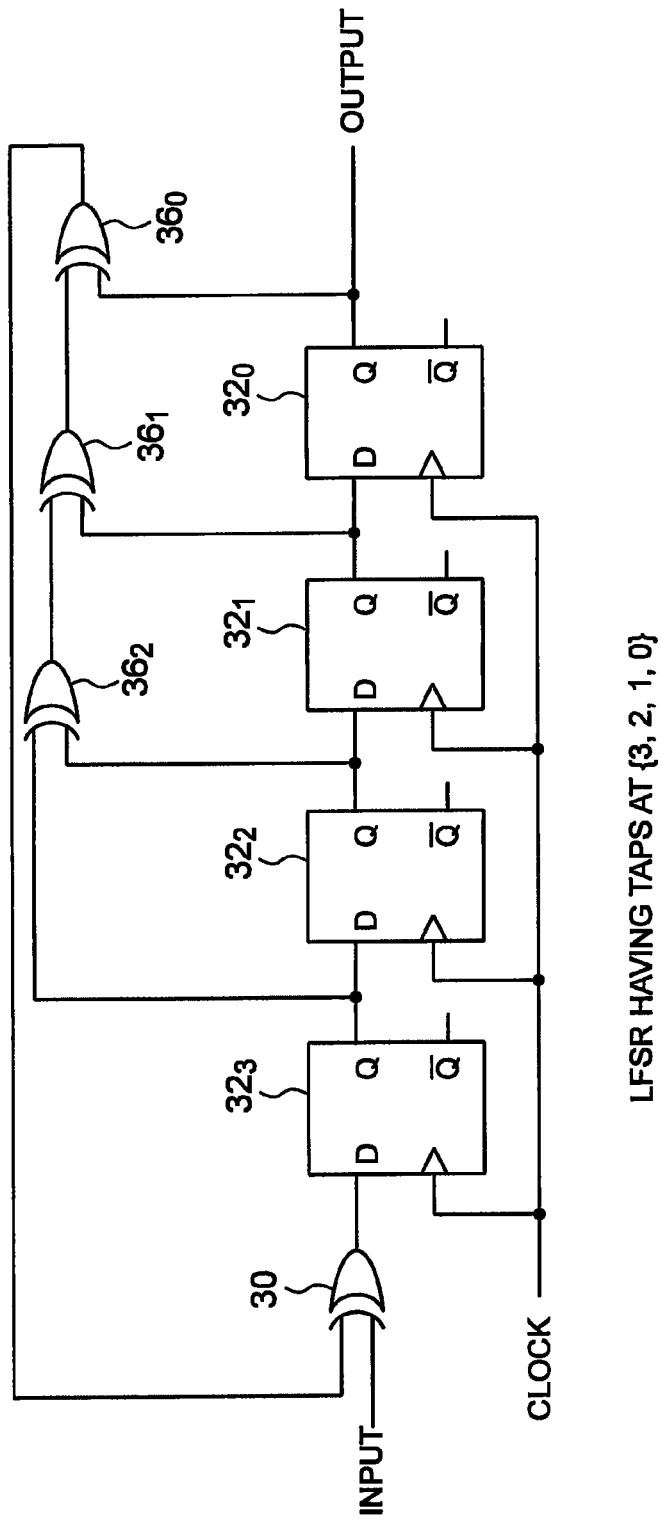
FIG. 4 is a specific circuit diagram of the LFSR shown in FIG. 3.

Many types of codes are disclosed by Stephen B. Wicker in "Error Control Systems for Digital Communication and Storage," Prentice Hall, 1995, and the like. FIG. 3 shows an example of the LFSR having taps (flip-flops) at {3, 2, 1, 0}. This LFSR includes the XOR gate 30, four series-connected flip-flops $32_3, 32_2, 32_1$, and $32_0$, and XOR gates $36_2, 36_1$, and $36_0$. That is, the LFSR shown in FIG. 3 is the same as the LFSR/ECC circuit 15 illustrated in FIG. 2 minus the pass transistors $34_3, 34_2, 34_1$, and $34_0$, the selector switch 37, and the selector switch circuit 38. FIG. 4 is a specific circuit diagram of the LFSR shown in FIG. 3. Where the taps are located is disclosed in Tables 17.1 and 17.2 of "Applied Cryptography, John Wiley & Sons, Inc., 2nd edition" by B. Schneier, for example.

Figure 5:
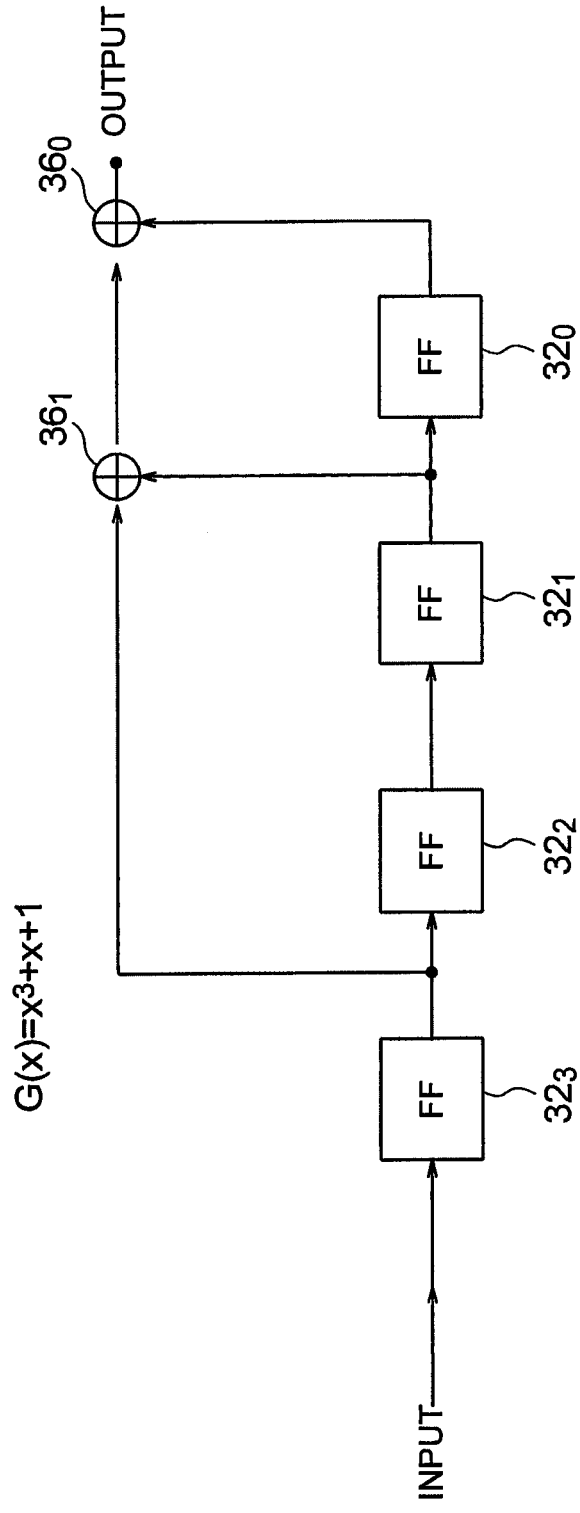
FIG. 5 is a diagram of a circuit for performing multiplication of a generator polynomial G(x) and random number data.

FIG. 5 is a circuit diagram representing a (7, 4)-code generator polynomial $G(x)=x^3+x+1$. This circuit includes the four series-connected flip-flops $32_3, 32_2, 32_1$, and $32_0$, and the XOR gates $36_1$ and $36_0$. That is, the circuit shown in FIG. 5 is the same as the LFSR/ECC circuit 15 shown FIG. 2 minus the pass transistors $34_3, 34_2, 34_1$, and $34_0$, the XOR gates 30 and $36_3$, the selector switch 37, and the selector switch circuit 38.

Figure 6:
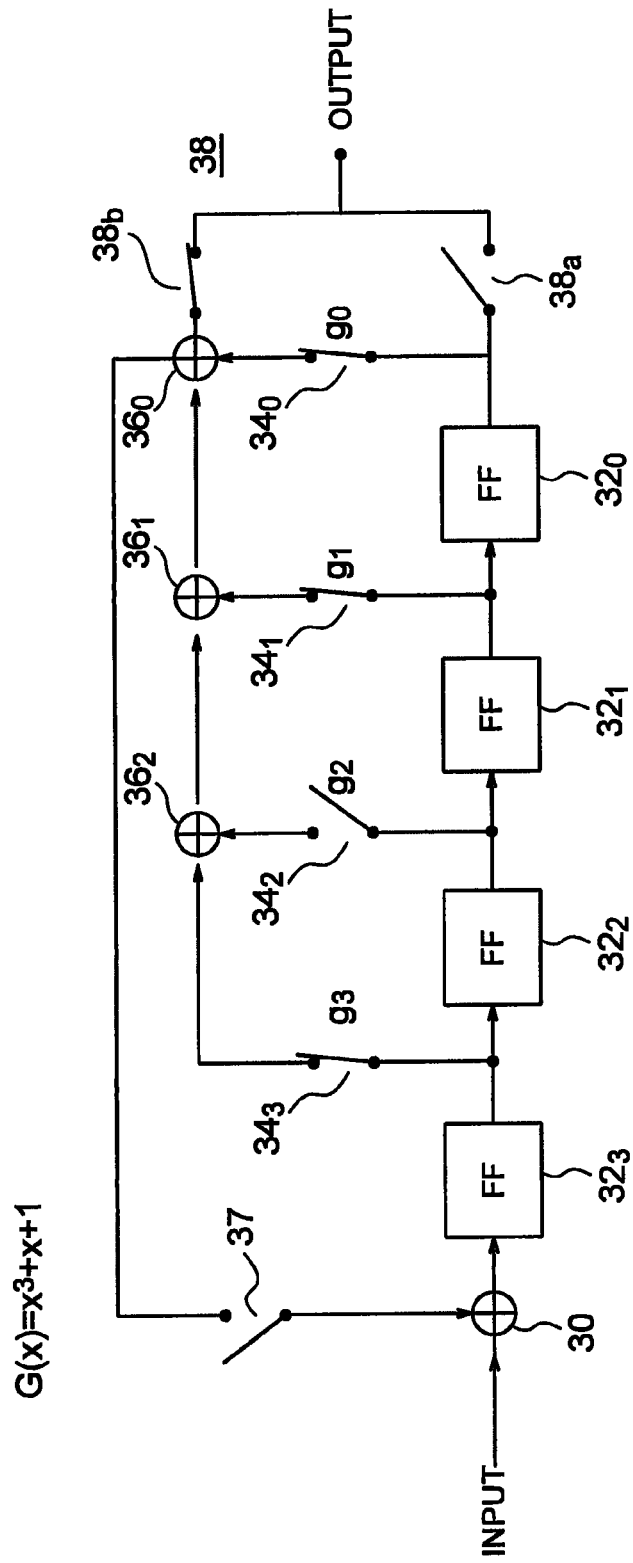
FIG. 6 is a diagram of a circuit that has the function combining the circuit illustrated in FIG. 3 and the circuit illustrated in FIG. 5.

The circuit illustrated in FIG. 6 realizes both the circuit illustrated in FIG. 3 and the circuit illustrated in FIG. 5 at the same time. In FIG. 6, when the selector switch 37, the switch 38a formed with a transistor, and the pass transistors $34_3, 34_2, 34_1$, and $34_0$ are put into an ON state, the LFSR shown in FIG. 3 is realized and can be used for smoothing physical random numbers as described in this embodiment. At this point, the switch 38b is in an OFF state. In FIG. 6, the selector switch 37, the switch 38a, and the pass transistor $34_2$ corresponding to the coefficient g2 are put into an OFF state, and the switch 38b is put into an ON state. In this manner, a random number generating matrix having an increased entropy as expressed by the matrix on the right-hand side of the equation (6) can be obtained. That is, the circuit illustrated in FIG. 6 serves as the LFSR/ECC circuit 15 of this embodiment to generate (7, 4) codes. In FIGS. 2 through 6, D flip-flops are used as the flip-flops. Those D flip-flops are synchronized by an input of a clock signal that is in synchronization with the system.

Figure 7:
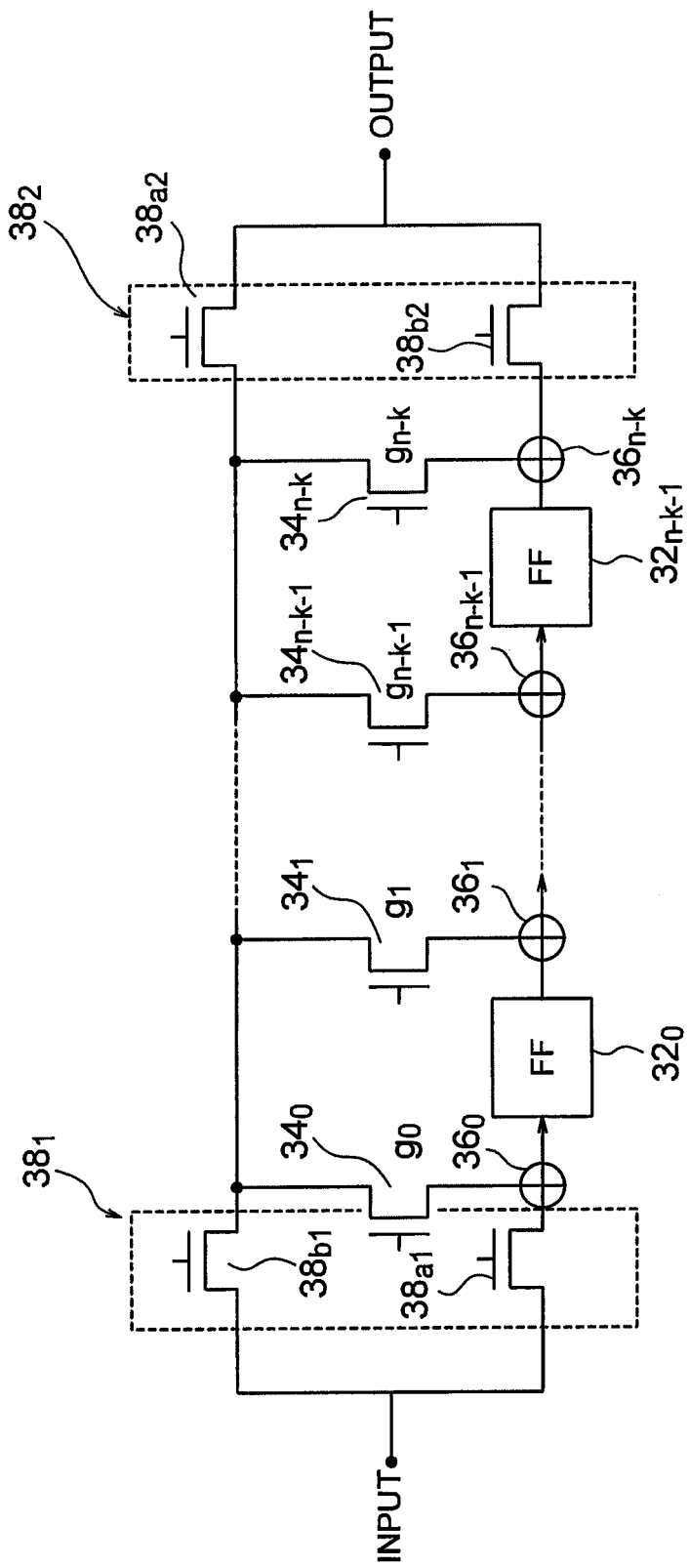
FIG. 7 shows a circuit as another specific example of the LFSR/ECC circuit according to the first embodiment.

Although a specific example of the LFSR/ECC circuit 15 of this embodiment is illustrated in FIG. 2, the circuit illustrated in FIG. 7 can also be used as another specific example. The circuit illustrated in FIG. 7 is equivalent to the circuit illustrated in FIG. 2, except for the locations of the XOR gates. The LFSR/ECC circuit 15 shown in FIG. 7 uses the generator polynomial expressed by the equation (4), and includes: a selector switch circuit $38_1$ that has N-channel transistors $38a_1$ and $38b_1$, and selects a digital random number sent as an input signal; (n–k) series-connected flip-flops $32_0, 32_1, \ldots$, and $32_{n-k-1}$; (n–k+1) N-channel pass transistors $34_0, 34_1, \ldots$, and $34_{n-k}$; (n–k) XOR gates $36_0, 36_1, \ldots$, and $36_{n-k-1}$; and a selector switch circuit $38_2$ that has N-channel transistors $38a_2$ and $38b_2$.

One terminal of each of the transistors $38a_1$ and $38b_1$ is connected to the input terminal. One terminal of each of the transistors $38a_2$ and $38b_2$ is connected to the output terminal. The other terminal of the transistor $38b_2$ is connected to the other terminal of the transistor $38a_2$.

One terminal of each pass transistor $34_i$ (i=0, 1, ..., n–k) is connected to the other terminal of the transistor $38b_2$, and the other terminal of each pass transistor $34_i$ is connected to one of the two input terminals of each corresponding XOR gate $36_i$. The gate of each pass transistor $34_i$ receives a signal corresponding to the ith-order coefficient $g_i$ of the generator polynomial stored in the memory 21. That is, where the ith-order coefficient $g_i$ of the generator polynomial is "0," the gate of each pass transistor $34_i$ (i=n–k, ..., 1, 0) receives a signal for switching off the pass transistor $34_i$. Where the coefficient $g_i$ of the generator polynomial is "1," the gate of each pass transistor $34_i$ receives a signal for switching on the pass transistor $34_i$.

The other input terminal of the XOR gate $36_0$ is connected to the other terminal of the transistor $38a_1$. Each flip-flop $32_i$ (i=0, 1, ..., n–k–1) is placed between the output terminal of each corresponding XOR gate $36_{i-1}$ and the other input terminal of each corresponding XOR gate $36_i$. The output terminal of the XOR gate $36_{n-k}$ is connected to the other terminal of the transistor $38b_2$.

When the circuit illustrated in FIG. 7 functions as a LFSR, the transistors $38a_1$ and $38a_2$ are in an ON state, and the transistors $38b_1$ and $38b_2$ are in an OFF state. When the circuit functions as an error correcting code (ECC) circuit, the transistors $38a_1$ and $38a_2$ are in an OFF state, and the transistors $38b_1$ and $38b_2$ are in an ON state.

Figure 8:
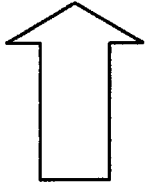
FIG. 8(a) is a diagram showing physical random numbers.
FIG. 8(b) is a diagram showing the results of tests conducted by multiplying the physical random numbers by a (7, 4) code once.

FIGS. 8(a) through 10(b) show the results of experiments and the results of statistical tests conducted where the above described code generating matrix is actually applied to random numbers generated with the use of a random number generating element having a SiN transistor especially when the quality of the random numbers in data is degraded. FIG. 8(a) shows two kinds of random number data A and B that are created by digitizing signals obtained from the random number generating element having a SiN transistor. FIG. 8(b) shows the results of a test conducted where the random number data A and B shown in FIG. 8(a) are multiplied by a (7, 4)-code code generating matrix once, and the statistical test of FIPS 140-2 is applied to the result of the multiplication. The FIPS 140-2 is a statistical test for evaluating the quality of 20,000 pieces of random number data defined by the National Institute of Standard and Technology(NIST), and there are the following four types of tests: the monobit test, the poker test, the run test, and the long run test. The outlines of those tests are as follows.

1. The Monobit Test

If the number of times "1" appears among the 20,000 pieces of data falls between 9,725 and 10,275, this test is passed. This test is equivalent to a case where the rate of rejection during a $\chi^2$-test at one degree of freedom is 0.01%.

2. The Poker Test

The 20,000 pieces of data are converted into 4-bit numbers in descending order, or are converted from 0, 1 into 1, ..., 15. Where f(i) represents the number of times i (0=<i<15) appears, the following equation is established:

$$V = \frac{16}{5000} \sum_{i=0}^{15} [f(i)]^2 - 5000$$

If V is larger than 2.16 and smaller than 46.17, this test is passed. This test is equivalent to a $\chi^2$-test at 15 degrees of freedom.

3. The Run Test

A check is to be made to determine what is the maximum number of successive "0s" or what is the maximum number of successive "1s." With "6" being the reference maximum number of successive "0s" or successive "1s," the test is passed when the numbers fall within the ranges shown in the following table with respect to both "0" and "1":

| Length of Run | Required Interval |
| --- | --- |
| [1] | 2,315-2,685 |
| [2] | 1,114-1,386 |
| [3] | 527-723 |
| [4] | 240-384 |
| [5] | 103-209 |
| [6+] | 103-209 |

4. The Long Run Test

If the number of successive "0s" or successive "1s" is 26 or less, this test is passed.

Referring back to FIG. 8(b), "NG" indicates cases where data does not pass a test, and "Pass" indicates cases where data passes a test. As can be seen from FIG. 8(b), the quality of random numbers is increased simply by multiplying random number data by a code generating matrix once. FIGS. 9(a) and 9(b) show the random number data obtained by twice applying a (7, 4)-code code generating matrix to the two types of random number data A and B generated by digitizing signals obtained from a random number generating element including a SiN transistor, and the results of the tests. A comparison between FIG. 8(a) and FIG. 9(a) shows that the quality of random numbers is greatly increased in FIG. 9(a).

FIGS. 10(a) and 10(b) show a (15, 5, 7)-Bose-Chaudhuri-Hocquenghem (BCH)-code generating matrix and the results of tests conducted by applying this generating matrix once. In the BCH code, 15 pieces of data are compressed to 5 pieces, and therefore, the degree of compression is expected to become higher. As can be seen from FIG. 10(b), however, the data compression rate alone does not lead directly to an increase in quality of random numbers. Since data with a poor random number quality is used in the first place, a test can be passed with one-time application of a code generating matrix if random access data with a higher quality is used. In general, the quality of physical random numbers is degraded due to a significantly large number of factors such as variations generated during the manufacture of random number generating elements and age-related degradation. As indicated through the above described example, there are cases where one-time application of a code generating matrix is insufficient. It is preferable to use the code generating matrix of an optimum code for each random number generator circuit. As described in this embodiment, it is critical to use such a code generating matrix together with a testing circuit.

Figure 11:
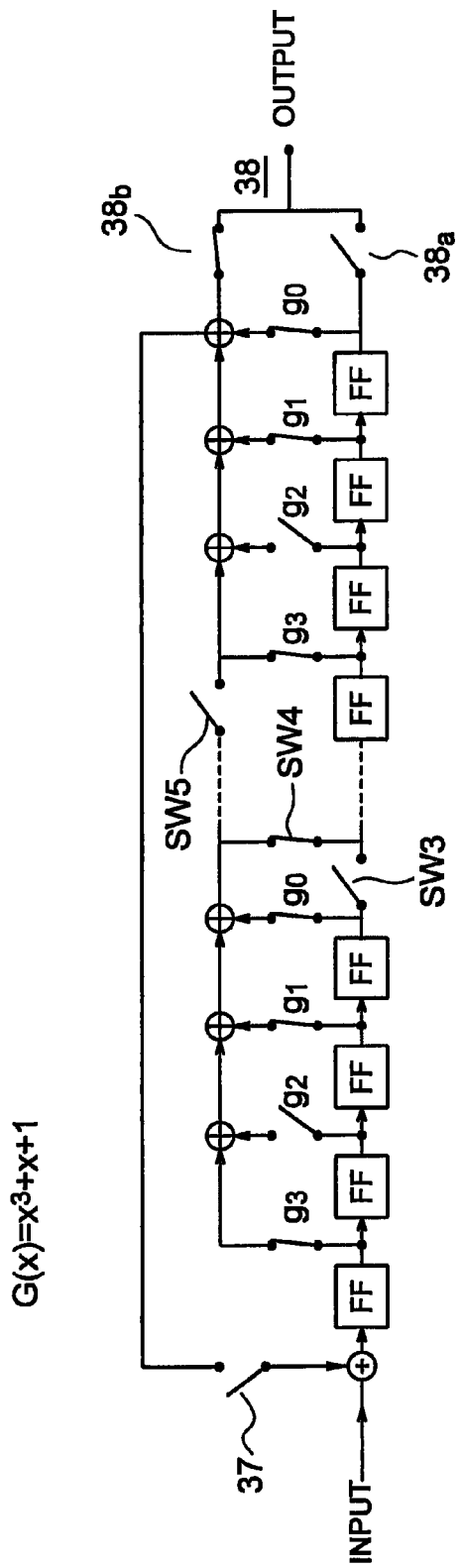
FIG. 11 is a diagram showing a LFSR/ECC circuit used in a case where a short-code generating matrix is applied to a LFSR having a large number of taps.

FIG. 11 shows an example case where a short-code generating matrix is applied to a LFSR with many taps. The LFSR can generate a maximum of ($2^n - 1$) pseudorandom numbers for the number n of taps. Some circuits might use LFSRs with large numbers of taps. In the example illustrated in FIG. 11, a (7, 4)-code code generating matrix is applied to a LFSR having eight or more taps. In the LFSR shown in FIG. 11, selector switches SW3, SW4, and SW5 are provided. The switches 37, 38a, SW3, and SW5 are in an ON state, and the switch SW4 is in an OFF state. To increase the random number quality with a code generating matrix, only the switch SW4 is put into an ON state. Although a (7, 4) code is used twice in the example illustrated in FIG. 11, such a code can be used three or more times if the LFSR is long, and two or more kinds of codes can be incorporated. It should be noted that conventional transistors can be used as the switch 37, the selector switches SW3 through SW5, and the switches 38a and 38b.

If random numbers with a low quality can be used, the LSFR is used as it is, and the pass line of the testing circuit is lowered. If random numbers with a high quality are required, an ECC can be used.

As described above, the ECC function is incorporated into a LFSR in this embodiment. Accordingly, the ECC function can be realized in a small area, and excess overhead can be minimized.

Second Embodiment

Figure 12:
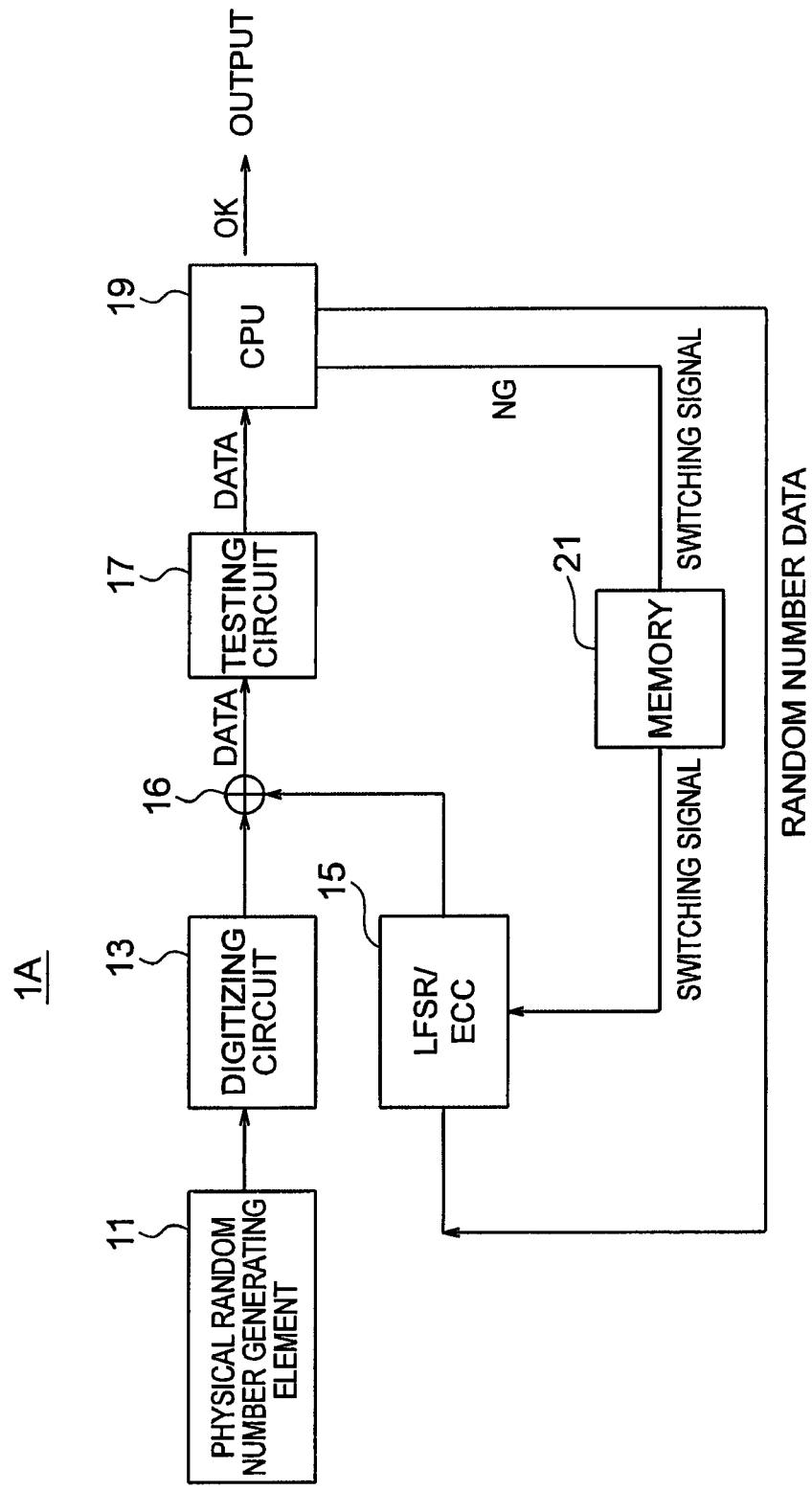
FIG. 12 is a block diagram showing a random number generator circuit according to a second embodiment.

FIG. 12 shows a random number generator circuit according to a second embodiment. The random number generator circuit 1A of this embodiment is the same as the random number generator circuit 1 of the first embodiment illustrated in FIG. 1, except that the LFSR/ECC circuit 15 connected in series to the digitizing circuit 13 is designed so that an XOR gate 16 performs an exclusive OR operation on the output of the LFSR/ECC circuit 15 and the output of the digitizing circuit 13, and sends the operation result to the testing circuit 17. In that case, the LFSR/ECC circuit 15 has the structure illustrated in FIG. 2 or 7, as in the first embodiment. However, the input signals to the XOR gate 30 are random number data sent form the CPU 19, unlike the input signals in the first embodiment. In this embodiment, when a test conducted by the testing circuit 17 is not passed, a switching signal is also sent from the CPU 19 to the memory 21. The selector switch 37 and the switch circuit 38 shown in FIG. 2 are switched as in the first embodiment, so that multiplication by a code generating matrix is performed at the LFSR/ECC circuit 15. Where the LFSR/ECC circuit 15 shown in FIG. 7 is used, the transistors of the switch circuits $38_1$ and $38_2$ are switched on and off, to perform the multiplication.

In this embodiment, the ECC function is incorporated into a LFSR as in the first embodiment. Accordingly, the ECC function can be realized in a small area, and excess overhead can be minimized.

Third Embodiment

Figure 13:
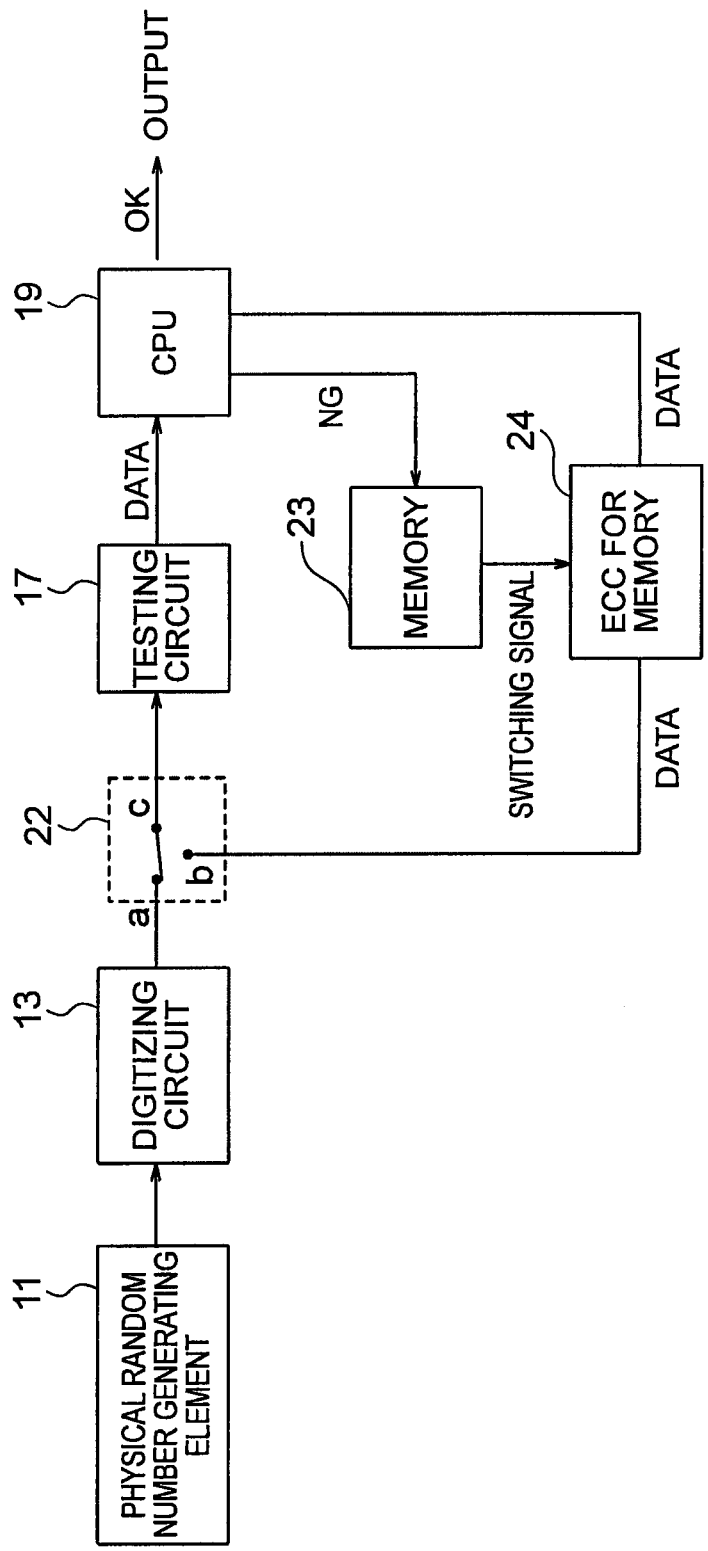
FIG. 13 is a block diagram showing a random number generator circuit according to a third embodiment.
Figure 14:
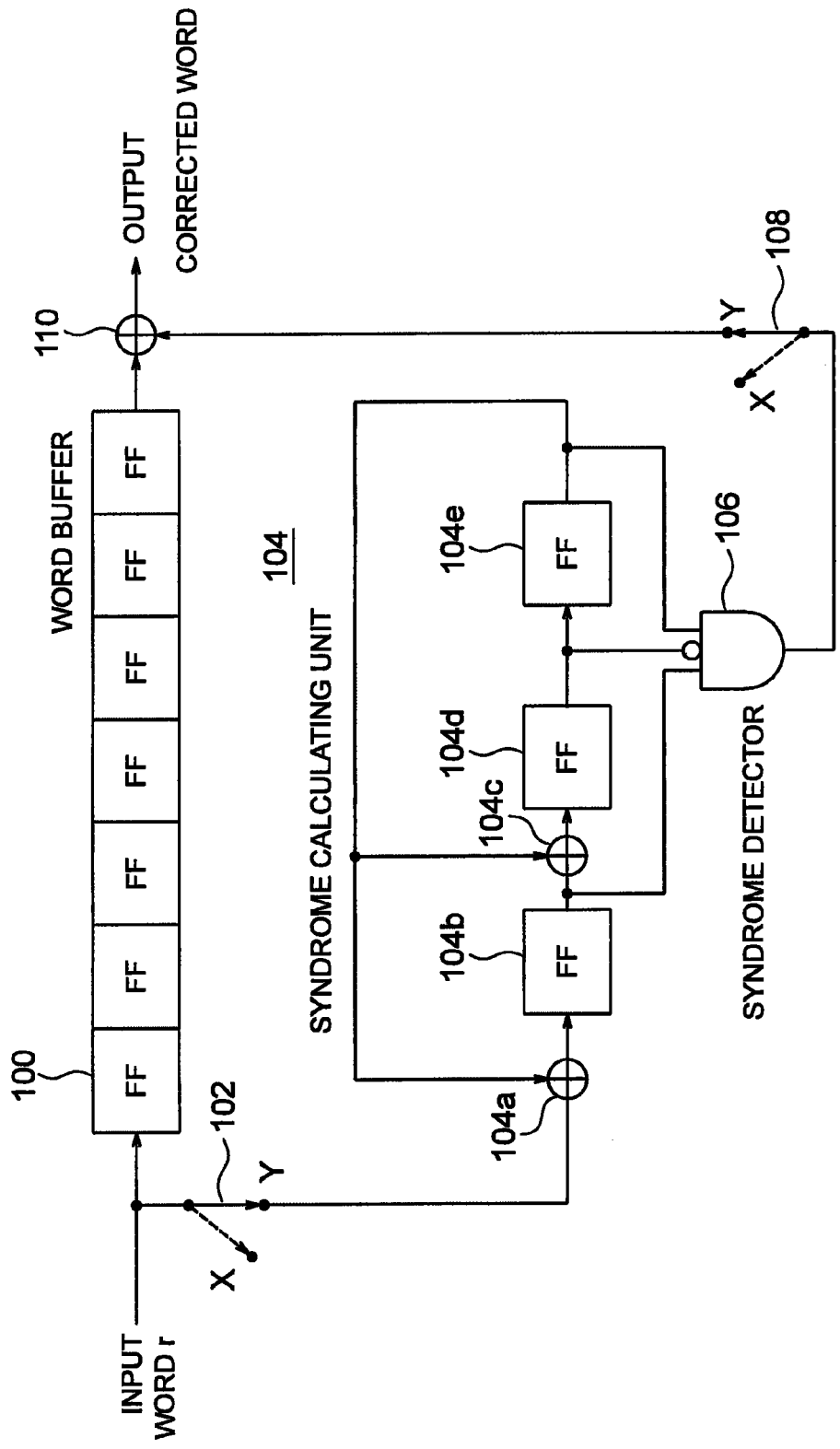
FIG. 14 is a circuit diagram showing an ECC circuit provided in a memory.
Figure 15:
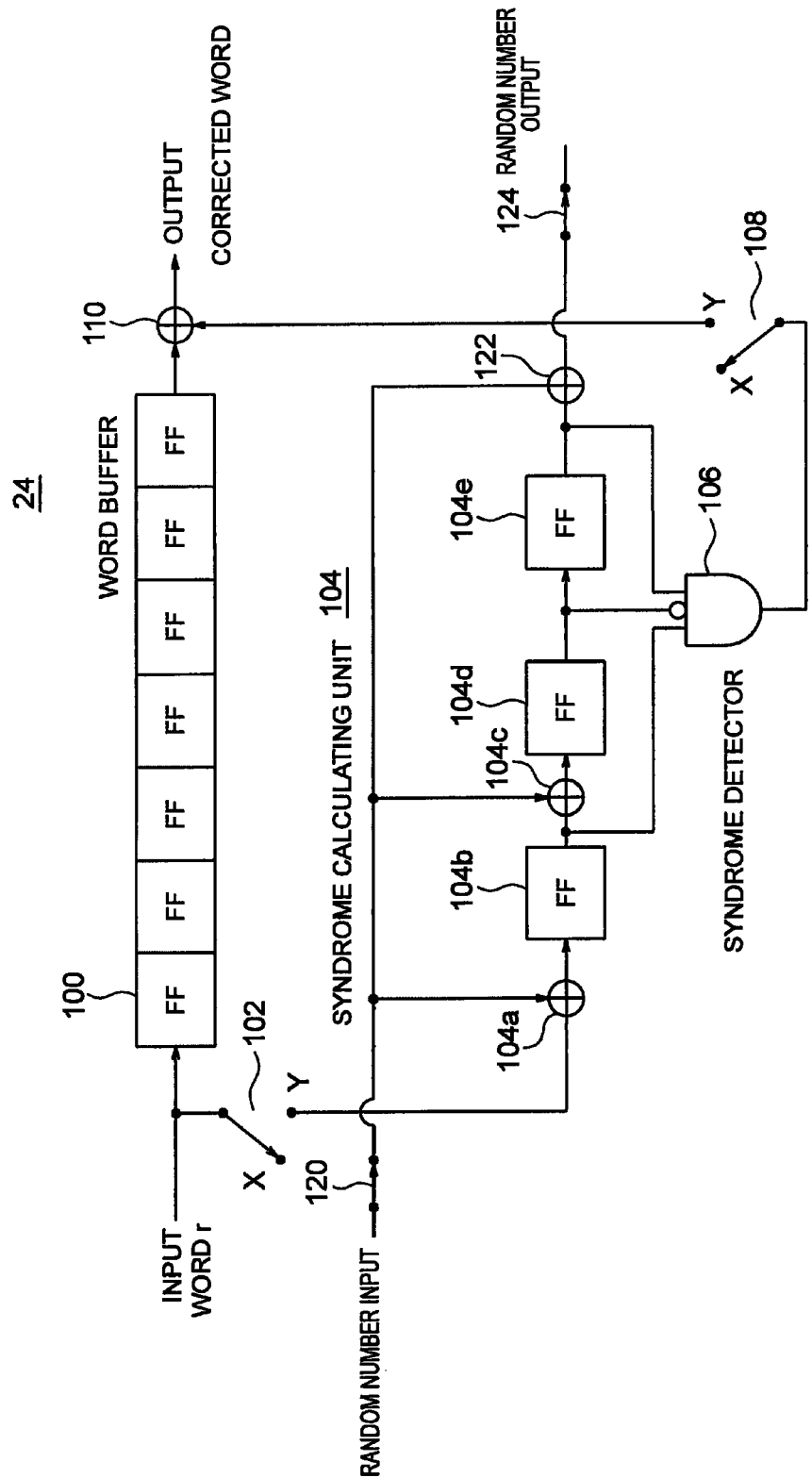
FIG. 15 is a circuit diagram showing the ECC circuit used in the third embodiment.

Referring now to FIGS. 13 through 15, a random number generating circuit according to a third embodiment is described. The random number generating circuit 1B of this embodiment uses an error correcting code circuit (ECC circuit) that is provided in a memory and is used for correcting data errors, to smooth random number data. The random number generator circuit 1B of this embodiment is the same as the random number generator circuit of the first embodiment illustrated in FIG. 1, except that a switch circuit 22 is provided in place of the LFSR/ECC circuit 15, the memory 21 is replaced with a memory 23 including an ECC circuit, and an ECC circuit 24 formed by providing a selector switch and an XOR gate on the ECC circuit of the memory 23.

An error correcting code circuit (ECC circuit) is normally provided in a memory (see FIGS. 5 through 11 of "Error Control Systems for Digital Communication and Storage" (by Stephen B. Wicker, Prentice Hall, 1995), for example). FIG. 14 shows a specific example of an ECC circuit provided in a memory. The ECC circuit of this specific example includes a word buffer 100 that receives and stores input word data, a switch 102, a syndrome calculating unit 104, a syndrome detector 106 including an AND gate, a switch 108, and an XOR gate 110. The switch 102 and the switch 108 interlock with each other. For example, where one of the switches 102 and 108 is connected to a contact point Y, the other one of the switches 102 and 108 is also connected to a contact point Y.

The syndrome calculating unit 104 includes XOR gates 104a and 104c, and flip-flops 104b, 104d, and 104e. Based on word data that is input through the switch 102 and the output of the flip-flop 104e, the XOR gate 104a performs an exclusive-OR operation and sends the operation result to the flip-flop 104b. Based on the output of the flip-flop 104b and the output of the flip-flop 104e, the XOR gate 104c performs an exclusive-OR operation and sends the operation result to the flip-flop 104d. The output of the flip-flop 104d is output to the flip-flop 104e. In the syndrome calculating unit 104, the flip-flops 104b, 104d, and 104e constitute a shift register.

Based on the output of the flip-flop 104b, the inverted value of the output of the flip-flop 104d, and the output of the flip-flop 104e, the AND gate of the syndrome detector 106 performs an AND operation, and sends the operation result to the XOR gate 110 via the switch 108. Based on the output of the AND gate sent via the switch 108 and the output of the word buffer 100, the XOR gate 110 performs an exclusive-OR operation and sends the operation result to the outside.

In the ECC circuit illustrated in FIG. 14, when input data (word data) is not to be corrected, the switch 102 and the switch 108 are put into an OFF state (in which the switch 102 and the switch 108 are connected to contact points X). In that case, the input data is output to the outside through the word buffer 100. When input data is to be corrected, the switch 102 and the switch 108 are put into an ON state (in which the switch 102 and the switch 108 are connected to the contact points Y). In that case, the input data is stored into the word buffer 100, and is sent to the syndrome calculating unit 104 for a syndrome calculation via the switch 102. Based on the calculation result, a syndrome is detected by the syndrome detector 106. The syndrome and the output of the word buffer 100 are subjected to an exclusive-OR operation at the XOR gate 110, so that a corrected word is output from the XOR gate 110. It should be noted that the circuit illustrated in FIG. 14 executes a decoding function through the switches 102 and 108.

FIG. 15 shows the ECC circuit 24 of this embodiment that uses the ECC circuit provided in the memory 23 as described above. The ECC circuit 24 is the same as the ECC circuit shown in FIG. 14, except that switches 120 and 124, and an XOR gate 122 are provided.

Random number data from the CPU 19 shown in FIG. 13 is sent to one of the input terminals of each of the XOR gates 104a, 104c, and 122 of the syndrome calculating unit 104 via the switch 120. Based on the random number data sent from the CPU 19 and the output of the flip-flop 104e, the XOR gate 122 performs an exclusive-OR operation, and outputs the operation result as corrected (smoothed) random number data via the switch 124. The corrected random number data output from the ECC circuit 24 is sent to the switch circuit 22 shown in FIG. 13. In this embodiment, random number data that is output from an XOR gate is the code-corrected random number data indicated by the right-hand side of the equation (6).

In the random number generator circuit of this embodiment, a contact point "a" and a contact point "c" of the switch circuit 22 are connected at first. Digitized random number data output from the digitizing circuit 13 is then sent to the testing circuit 17, and is subjected to a test. If the test conducted at the testing circuit 17 is passed (OK), the random number data is output to the outside via the CPU 19. If the test is not passed (NG), the random number data is sent from the CPU 19 to the ECC circuit 24. At this point, a contact point b and the contact point c of the switch circuit 22 are connected. As a result, the random number data corrected by the ECC circuit 24 is sent to the testing circuit 17 via the switch circuit 22, and is subjected to a test. If the test is passed, the random number data is output to the outside via the CPU 19. If the test is not passed (NG), the random number data is sent from the CPU 19 to the ECC circuit 24, and the above described procedures are repeated.

As described above, according to this embodiment, the ECC function is incorporated into a memory. Accordingly, the ECC function can be realized in a small area, and excess overhead can be minimized.

Fourth Embodiment

Figure 16:
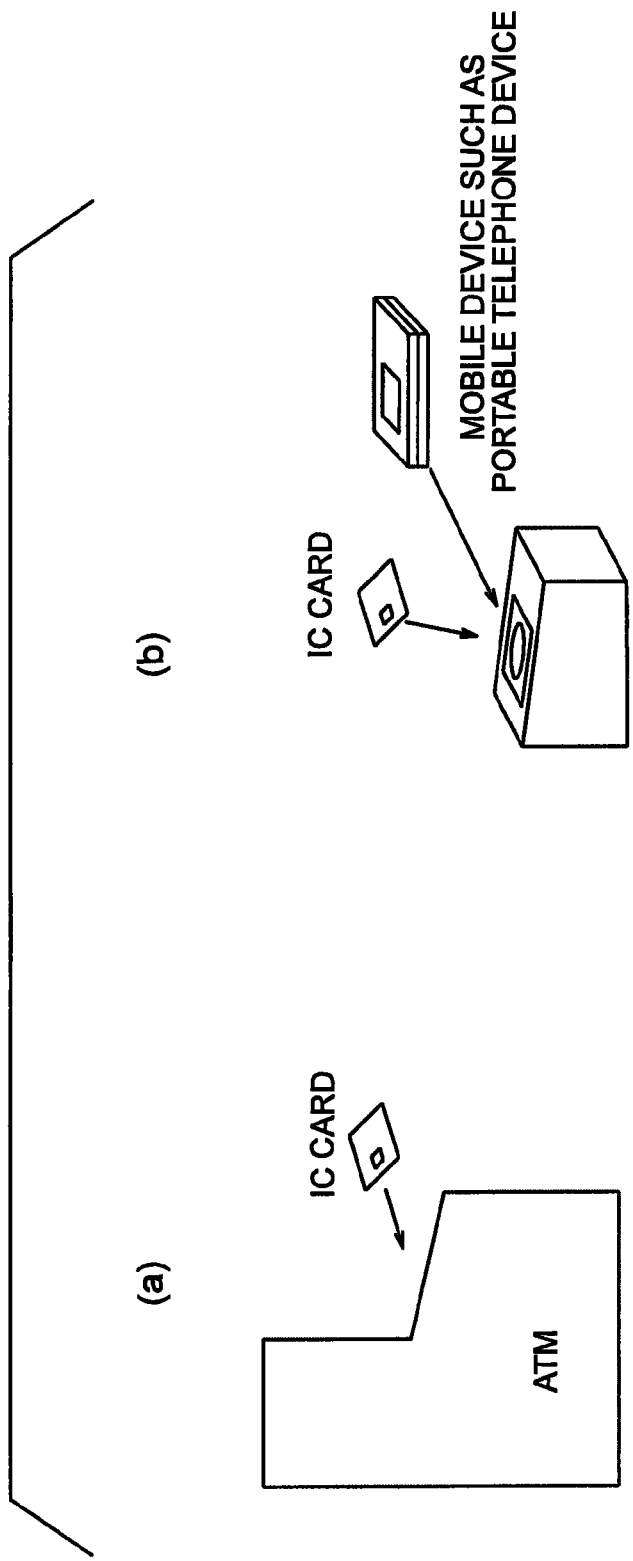
FIGS. 16($a$) and 16($b$) are diagrams for explaining a cryptographic circuit according to a fourth embodiment.
Figure 17:
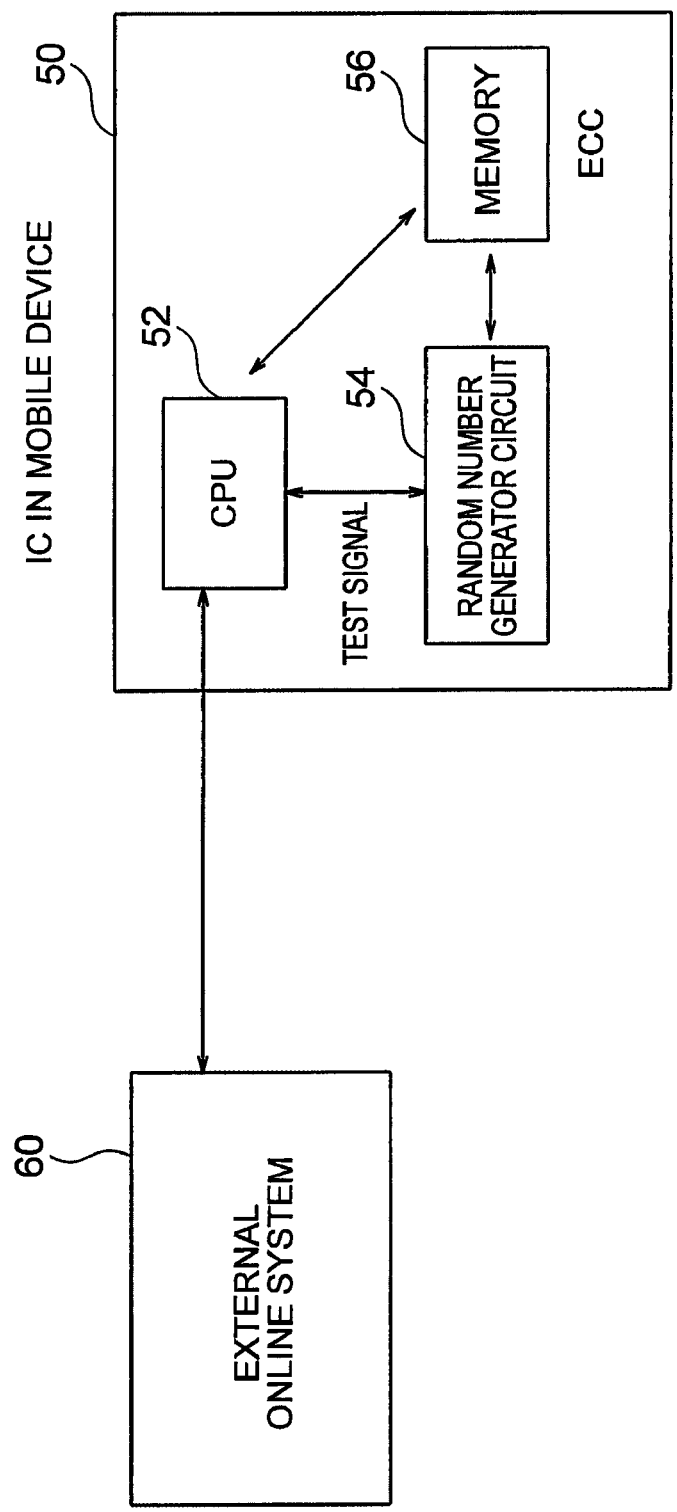
FIG. 17 is a diagram for explaining the cryptographic circuit according to the fourth embodiment.

Referring now to FIGS. 16(a) through 17, a cryptographic circuit according to a fourth embodiment is described. The cryptographic circuit of this embodiment includes a random number generator circuit of one of the first through third embodiments, and is used in an IC card or a mobile device, for example. In this embodiment, which code or generating matrix among those stored in the memory of the random number generator circuit can be used can be changed when a user accesses the device that reads information from an IC card serving as the cryptographic circuit, for example. Specifically, the cryptographic circuit of this embodiment is used in the situations illustrated in FIGS. 16(a) and 16(b). FIG. 16(a) illustrates a situation where a user uses an IC card as a cryptographic circuit to transfer or receive money or personal information through an automated teller machine (ATM) at a financial institute such as a bank or a post office, or an ATM used for residential information registration by a public office. FIG. 16(b) illustrates a situation where electronic money, personal information, data, and the like are wirelessly exchanged between a reader terminal placed at a convenience store or on a train or a bus, and a mobile device that is a cryptographic circuit of this embodiment, such as a portable telephone device or a small-sized PC. The ATM and the reader terminal provided in public places are connected to the main computer of a company or a public office or to a server via a data line, and therefore, will be hereinafter referred to as the system.

In a case where a user uses an IC card or a mobile device as the cryptographic circuit 50 of this embodiment as shown in FIG. 17, the system 60 first needs to perform personal verification of the cryptographic circuit 50. At this point, the system 60 is to read the personal information stored in a memory 56 in the IC card or the mobile device, which is the cryptographic circuit of this embodiment, via a CPU 52 of the cryptographic circuit 50. In this embodiment, when the system 60 communicates with the IC card or the mobile device as the cryptographic circuit 50, the CPU 52 tests the quality of random numbers generated from a random number generator circuit 54. If degradation is observed in the quality of the random numbers, the random numbers are multiplied by an error-correcting-code generating matrix of the first through third embodiments, in accordance with the degree of degradation. For example, in a case where random numbers to which an error-correcting-code generating matrix does not need to be applied at the point of sale are degraded, the random numbers are multiplied by an error-correcting-code generating matrix of the first through third embodiments once, and random number data is then output. If the degradation further progresses, the number of times multiplication is performed with a generating matrix is increased from one to two, for example. Which error-correcting-code generating matrix is to be applied is determined through several patterns formed by a computer on the system side, in accordance with the degree of degradation or the like. The results are written into the memory unit of the mobile device, so that a corrected error-correcting-code generating matrix can be automatically applied. As shown in FIG. 2, the LFSR/ECC circuit 15 can change codes to be selected through the respective switches, for example. Therefore, by storing change information indicating which switch is to be switched on and off into the memory of the mobile device, the quality of random numbers can be maintained at a high level, in spite of age-related degradation.

In this embodiment, when random numbers output from the random number generator circuit are tested and degradation is observed, the random numbers are multiplied by an error-correcting-code generating matrix, to change the random number quality. However, when the cryptographic circuit is accessed by the system, the random numbers may be multiplied by an error-correcting-code generating matrix, without the test. This approach is effective in a case where the CPU is to change the random number quality or where the random numbers output from the random number generator circuit are degraded because a considerable number of years have passed since the manufacture of the cryptographic circuit, for example.

As described above, according to this embodiment, the ECC function is incorporated into a LFSR. Accordingly, the ECC function can be realized in a small area, and excess overhead can be minimized.

In the above embodiments, code generating matrixes are described as simple linear code matrixes. However, various kinds of codes can be applied, and it is possible to employ generating matrixes using general cyclic codes, hamming codes, BCH codes, Reed-Solomon codes, turbo codes, and the like, which are disclosed in the above mentioned literature, "Error Control Systems for Digital Communication and Storage" (by Stephen B. Wicker, Prentice Hall, 1995), or the like.

As described above, as the physical random number generating element, one of the following devices can be used: a device that uses a quantum-dot system as disclosed in Japanese Patent Publication No. 3974429; a MOSFET having conductive fine particles that can perform electron charge and discharge on the channel via a tunnel insulating film, as disclosed in JP-A 2005-167165(KOKAI); a MOSFET that has random noise in the current flowing between the source and the drain, as disclosed in JP-A 2008-299595; a device that uses a trap existing therein, as disclosed in U.S. Pat. No. 7,426,527 and German Patent Publication No. 102004011170; a device that utilizes current fluctuations as disclosed in French Patent Publication No. 2817361, and the like. In those physical random number generating elements, transistor degradation such as degradation of the gate insulating film might occur when fluctuations in conventional transistors are used. Therefore, when such a physical random number generating element is used, it is effective to form a structure such as a random number generator circuit of one of the first through third embodiments.

While certain embodiments have been described, these embodiments have been presented by way of example only, and are not intended to limit the scope of the inventions. Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

What is claimed is:

1. A random number generator circuit comprising:
a physical random number generating element generating and outputting physical random numbers;
a digitizing circuit digitizing the physical random numbers and outputting a random number sequence;
a testing circuit testing the random number sequence;
a first memory storing information about error-correcting-code; and
an error correcting code circuit including: a first XOR gate including an input terminal to receive digital random numbers that are sent as input signals; a shift register including a plurality of flip-flops connected in series, one in a first stage of the flip-flops receiving an output of the first XOR gate; a plurality of pass transistors corresponding to the respective flip-flops, one terminal of each of the pass transistors being connected to an output terminal of each corresponding one of the flip-flops, a gate of each of the pass transistors receiving a signal in accordance with the information stored in the first memory; a plurality of second XOR gates corresponding to the respective pass transistors except one of the pass transistors corresponding to one in a first stage of the flip-flops and connected in series, one in a first stage of the second XOR gates performing an exclusive-OR operation on signals that are sent from another terminal of corresponding one of the pass transistors and another terminal of the one of the pass transistors corresponding to the one in the first stage of the flip-flops, each of the second XOR gates except the one in the first stage of the second XOR gates performing an exclusive-OR operation on signals that are sent from another terminal of each corresponding one of the pass transistors and an output terminal of each one in a precedent stage of the second XOR gates; a switch being switched on and off in accordance with the result of a test conducted by the testing circuit, and sending an output of one in the last stage of the second XOR gates to the other input terminal of the first XOR gate; and a selector switch selecting and outputting one of an output of the flip-flop in the last stage of the shift register and the output of the one in the last stage of the second XOR gates, in accordance with the result of the test conducted by the testing circuit, the error correcting code circuit outputting the output of the one in the last stage of the second XOR gates as a corrected random number sequence from the selector switch when the result of the test conducted by the testing circuit indicates a rejection, and the testing circuit testing the corrected random number sequence when the result of the test indicates the rejection.

2. The circuit according to claim 1, wherein the error correcting code circuit is placed between the digitizing circuit and the testing circuit, and receives the random number sequence as digital random numbers from the digitizing circuit and sends the corrected random number sequence to the testing circuit.

3. The circuit according to claim 2, wherein the information stored in the first memory includes a coefficient of each order of a generator polynomial of an error-correcting-code generating matrix, and wherein each of the gates of the pass transistors receives corresponding one of the coefficients of the respective orders of the generator polynomial of the error-correcting-code generating matrix, and the pass transistors are switched on and off based on the information stored in the first memory.

4. The circuit according to claim 1, further comprising a third XOR gate performing an exclusive-OR operation on the output of the digitizing circuit and the output of the error correcting code circuit, wherein the testing circuit tests a random number sequence that is output from the third XOR gate.

5. The circuit according to claim 4, wherein the information stored in the first memory includes a coefficient of each order of a generator polynomial of an error-correcting-code generating matrix, and wherein each of the gates of the pass transistors receives corresponding one of the coefficients of the respective orders of the generator polynomial of the error-correcting-code generating matrix, and the pass transistors are switched on and off based on the information stored in the first memory.

6. The circuit according to claim 1, further comprising a second memory, wherein the error correcting code circuit is included in the second memory.

7. A cryptographic circuit comprising:

the random number generator circuit according to claim 1;

a second memory storing personal information; and a CPU, wherein, when the cryptographic circuit is connected to a system for personal verification, the CPU causes the error correcting code circuit to output the corrected random number sequence, to change random number quality.

8. The circuit according to claim 7, wherein the error correcting code circuit is placed between the digitizing circuit and the testing circuit, and receives the random number sequence as digital random numbers from the digitizing circuit and sends the corrected random number sequence to the testing circuit.

9. The circuit according to claim 8, wherein the information stored in the first memory includes about a coefficient of each order of a generator polynomial of the error-correcting-code generating matrix, and wherein each of the gates of the pass transistors receives corresponding one of the coefficients of the respective orders of the generator polynomial of the error-correcting-code generating matrix, and the pass transistors are switched on and off based on the information stored in the first memory.

10. The circuit according to claim 7, further comprising a third XOR gate performing an exclusive-OR operation on the output of the digitizing circuit and the output of the error correcting code circuit, wherein the testing circuit tests a random number sequence that is output from the third XOR gate.

11. The circuit according to claim 7, further comprising a third memory, wherein the error correcting code circuit is included in the third memory.

12. A random number generator circuit comprising:

a physical random number generating element generating and outputting physical random numbers;

a digitizing circuit digitizing the physical random numbers and outputting a random number sequence;

a testing circuit testing the random number sequence;

a first memory storing information about error-correcting-code; and an error correcting code circuit including: a shift register including a plurality of flip-flops connected in series; a first XOR gate provided on an input side of the flip-flop in the input stage of the shift register; a plurality of second XOR gates provided between the respective adjacent flip-flops; a third XOR gate provided on an output side of the flip-flop in the last stage of the shift register; a plurality of pass transistors corresponding to the respective first through third XOR gates, one terminal of each of the pass transistors being connected to an input terminal of each corresponding one of the XOR gates, the other terminals of the pass transistors being connected together, a gate of each of the pass transistors receiving a signal in accordance with a coefficient of a generator polynomial of the error correcting code generating matrix the information stored in the first memory; a first selector switch circuit selectively sending an input signal to the other terminal of each of the pass transistors or to the other input terminal of the first XOR gate, in accordance with the result of a test conducted by the testing circuit; and a second selector switch circuit selectively sending one of a signal at the other terminal of each of the pass transistors and an output of the third XOR gate, in accordance with the result of the test conducted by the testing circuit.

13. A cryptographic circuit comprising:
the random number generator circuit according to claim 8;
a second memory storing personal information; and
a CPU,
wherein, when the cryptographic circuit is connected to a system for personal verification, the CPU causes the error correcting code circuit to output a corrected random number sequence, to change random number quality.

14. The circuit according to claim 13, wherein
the information stored in the first memory includes a coefficient of each order of a generator polynomial of an error-correcting-code generating matrix,
wherein each of the gates of the pass transistors receives corresponding one of the coefficients of the respective orders of the generator polynomial of the error-correcting-code generating matrix, and the pass transistors are switched on and off based on the information stored in the first memory.

15. The circuit according to claim 13, wherein
the error correcting code circuit is placed between the digitizing circuit and the testing circuit, and receives the random number sequence as digital random numbers from the digitizing circuit and sends the corrected random number sequence to the testing circuit.

16. The circuit according to claim 15, wherein
the information stored in the first memory includes a coefficient of each order of a generator polynomial of the error-correcting-code generating matrix, and
wherein each of the gates of the pass transistors receives corresponding one of the coefficients of the respective orders of the generator polynomial of the error-correcting-code generating matrix, and the pass transistors are switched on and off based on the information stored in the first memory.

17. The circuit according to claim 13, further comprising
a fourth XOR gate performing an exclusive-OR operation on the output of the digitizing circuit and the output of the error correcting code circuit,
wherein the testing circuit tests a random number sequence that is output from the fourth XOR gate.

18. The circuit according to claim 17, wherein
the information stored in the first memory includes a coefficient of each order of a generator polynomial of an error-correcting-code generating matrix, and
wherein each of the gates of the pass transistors receives corresponding one of the coefficients of the respective orders of the generator polynomial of the error-correcting-code generating matrix, and the pass transistors are switched on and off based on the information stored in the first memory.

19. The circuit according to claim 12, wherein
the error correcting code circuit is placed between the digitizing circuit and the testing circuit, and receives the random number sequence as digital random numbers from the digitizing circuit and sends the corrected random number sequence to the testing circuit.

20. The circuit according to claim 19,
wherein the information stored in the first memory includes a coefficient of each order of a generator polynomial of an error-correcting-code generating matrix, and
wherein each of the gates of the pass transistors receives corresponding one of the coefficients of the respective orders of the generator polynomial of the error-correcting-code generating matrix, and the pass transistors are switched on and off based on the information stored in the first memory.

21. The circuit according to claim 12, further comprising
a fourth XOR gate performing an exclusive-OR operation on the output of the digitizing circuit and the output of the error correcting code circuit,
wherein
the testing circuit tests a random number sequence that is output from the fourth XOR gate.

22. The circuit according to claim 21,
wherein
the information stored in the first memory includes a coefficient of each order of a generator polynomial of the error-correcting-code generating matrix, and
wherein each of the gates of the pass transistors receives corresponding one of the coefficients of the respective orders of the generator polynomial of the error-correcting-code generating matrix, and the pass transistors are switched on and off based on the information stored in the first memory.

* * * * *